United States Patent
Aritome et al.

(10) Patent No.: US 8,619,475 B2
(45) Date of Patent: Dec. 31, 2013

(54) METHODS TO OPERATE A MEMORY CELL

(75) Inventors: Seiichi Aritome, Sungnam (KR); Soojin Wi, Icheon-si (KR); Angelo Visconti, Appiano Gentile (IT); Silvia Beltrami, Bartolomeo (IT); Christian Monzio Compagnoni, Olgiate Olona (IT); Alessandro Sottocornola Spinelli, Bergamo (IT)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 13/204,014

(22) Filed: Aug. 5, 2011

(65) Prior Publication Data
US 2013/0033936 A1    Feb. 7, 2013

(51) Int. Cl.
G11C 11/34    (2006.01)

(52) U.S. Cl.
USPC .................................................. 365/185.19

(58) Field of Classification Search
USPC .................................................. 365/185.03
See application file for complete search history.

(56) References Cited

U.S. PATENT DOCUMENTS

| | | | |
|---|---|---|---|
| 6,411,551 B1 | 6/2002 | Kim et al. | |
| 7,508,705 B2 | 3/2009 | Chae et al. | |
| 7,580,302 B2 | 8/2009 | Ho et al. | |
| 7,656,709 B2 | 2/2010 | Goda et al. | |
| 7,729,172 B2 | 6/2010 | Park | |
| 2008/0101126 A1* | 5/2008 | Hemink et al. | 365/185.19 |
| 2010/0208524 A1 | 8/2010 | Sarin et al. | |
| 2011/0080789 A1* | 4/2011 | Kalavade et al. | 365/185.19 |

* cited by examiner

Primary Examiner — Anthan Tran
(74) Attorney, Agent, or Firm — Leffert Jay & Polglaze, P.A.

(57) ABSTRACT

Memory devices and methods for operating a memory cell are disclosed, such as a method that uses two program verify levels (e.g., low program verify level and program verify level) to determine how a data line voltage should be increased. A threshold voltage of a memory cell that has been biased with a programming voltage is determined and its relationship with the two program verify levels is determined. If the threshold voltage is less than the low program verify level, the data line can be biased at a ground voltage (e.g., 0V) for a subsequent programming pulse. If the threshold voltage is greater than the program verify level, the data line can be biased at an inhibit voltage for a subsequent programming pulse. If the threshold voltage is between the two program verify levels, the data line voltage can be increased for each subsequent programming pulse in which the threshold voltage is between the two program verify levels.

17 Claims, 7 Drawing Sheets

US 8,619,475 B2

METHODS TO OPERATE A MEMORY CELL

TECHNICAL FIELD

The present invention relates generally to memory and in a particular embodiment the present invention relates to program verify in a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

Operation of memory cells in electronic devices includes applying electrical signals to their terminals so as to modify the threshold voltage of the memory transistors in a finely controlled way. Data storage is obtained associating logical values to different possible ranges of threshold voltage. FIG. 1 shows a plot of word line voltage $V_{WL}$ versus time of typical prior art programming and verification operations. The figure shows the series of incrementally increasing programming pulses 101 being applied to a control gate of a target memory cell as the word line voltage $V_{WL}$. Each programming pulse 101 has a programming voltage $V_{pgm}$ that is increased by a step voltage from the previous programming pulse. Each programming pulse increases a charge level on a charge trapping material (e.g., floating gate) of the target memory cell, thereby increasing the cell's threshold voltage $V_t$. After each programming pulse 101, a verify pulse 102 occurs at a verify voltage $V_{vfy}$ to determine if the cell's threshold voltage has increased to the target level.

FIG. 2 shows the results of programming a number of memory cells using the programming/verify pulses of FIG. 1. The dotted line 200 represents a $V_t$ distribution prior to programming (e.g., erased) and the solid line 201 represents a final distribution of programmed memory cells at their target level. FIG. 2 shows that the initial distribution is moved as the threshold voltages of the memory cells are increased by the programming pulses.

Typical non-volatile memory cells can be programmed as single level memory cells (SLC), such as illustrated in FIG. 2, or multiple level memory cells (MLC). SLC memory cells store a single bit of information and are programmed from the erased state (e.g., logical 1) to a single programmed state (e.g., logical 0). MLC memory cells store two or more bits of information and are programmed from the erased state (e.g., logical 11) to one of multiple different programmed states (e.g., logical 01, 00, 10), wherein the erased state and programmed states are hereinafter collectively referred to as "data" states.

FIG. 3 shows a typical prior art diagram of $V_t$ distributions of four possible states available for data storage in MLC memory cells of an array (e.g., logical 11, 01, 00, 10). This figure shows the number of cells in each programmed or erased state versus the memory cells' threshold voltage $V_t$.

FIG. 3 shows that the 11 data state 301 is the most negative state and is typically referred to as the erased state. The 10 data state 302 is the most positive state. The 01 data state 303 and the 00 data state 304 are located between the most negative and most positive states 301, 302. Different encodings of the threshold voltage distributions into data states are possible. The distributions of FIG. 3 are separated by margins 310, 311 between the states 303-304 and 304-302, respectively. Margins 310 and 311 and the margin between erased state 301 and the first programmed state 303 allow unambiguously assignment of a data state (e.g., a bit pattern) to each memory cell, based on its threshold voltage value.

A typical non-volatile memory device has only a limited threshold voltage range, referred to in the art as a window margin, in which the programmed data states have to fit. Thus, the greater the number of possible data states in a memory device, the tighter the $V_t$ distributions have to be in order to remain within the window margin and still maintain margins between the states. In an SLC memory device, a $V_t$ distribution enlargement does not typically affect the reading of a programmed memory cell. However, in an MLC memory device, enlarged $V_t$ distributions might overlap and result in errors in reading the different data states.

For the reasons stated above, and for other reasons stated below that will become apparent to those skilled in the art upon reading and understanding the present specification, there is a need in the art to tighten threshold voltage distributions in a memory device.

DETAILED DESCRIPTION

Figure 1:
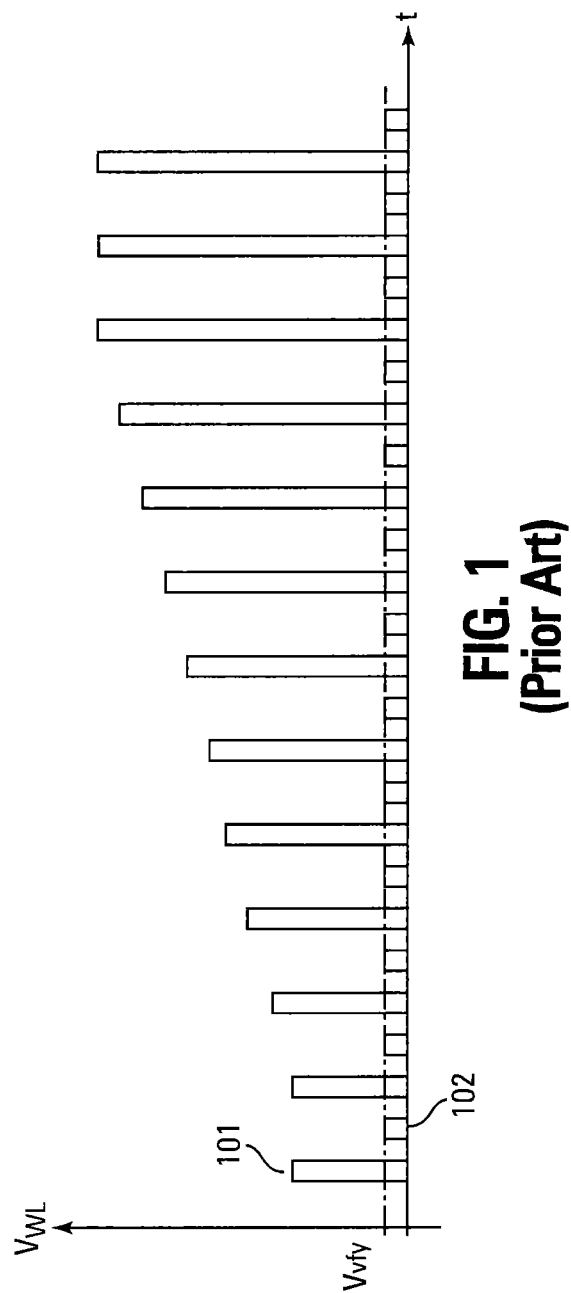
FIG. 1 shows a plot of word line voltage $V_{WL}$ versus time t of a typical prior art programming operation.
Figure 2:
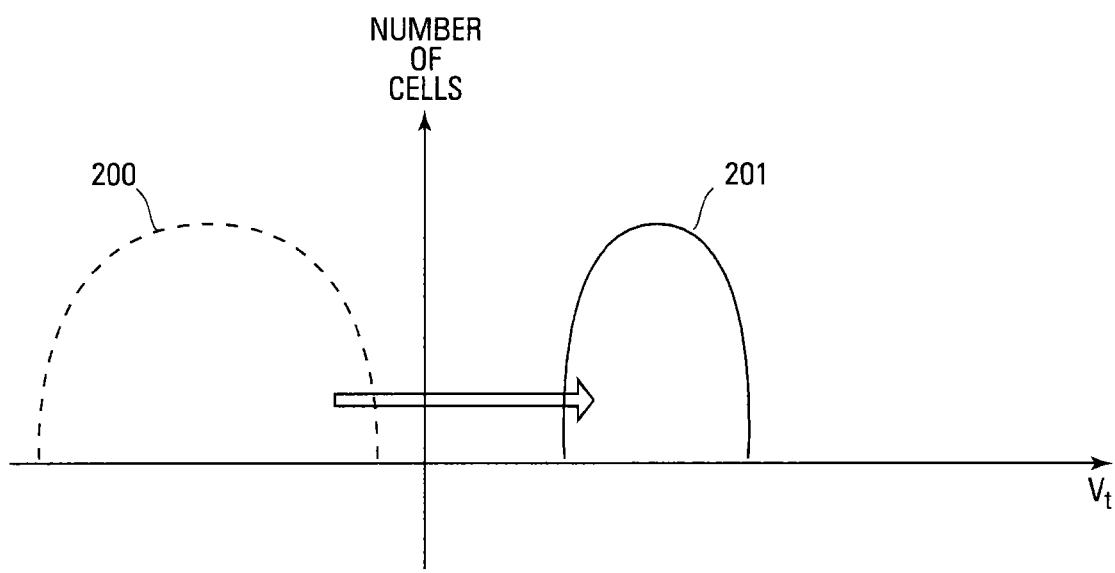
FIG. 2 shows typical prior art threshold voltage $V_t$ distributions of an SLC memory device in accordance with the programming operation of FIG. 1.
Figure 3:
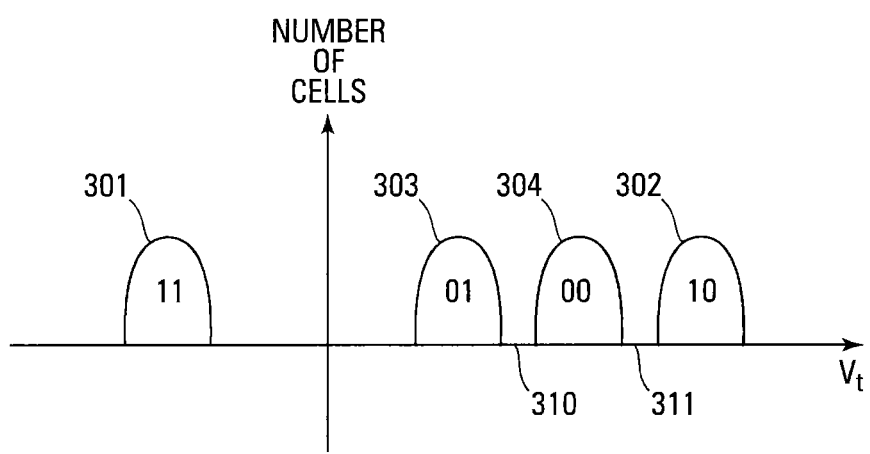
FIG. 3 shows typical prior art threshold voltage $V_t$ distributions of an MLC memory device.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 4:
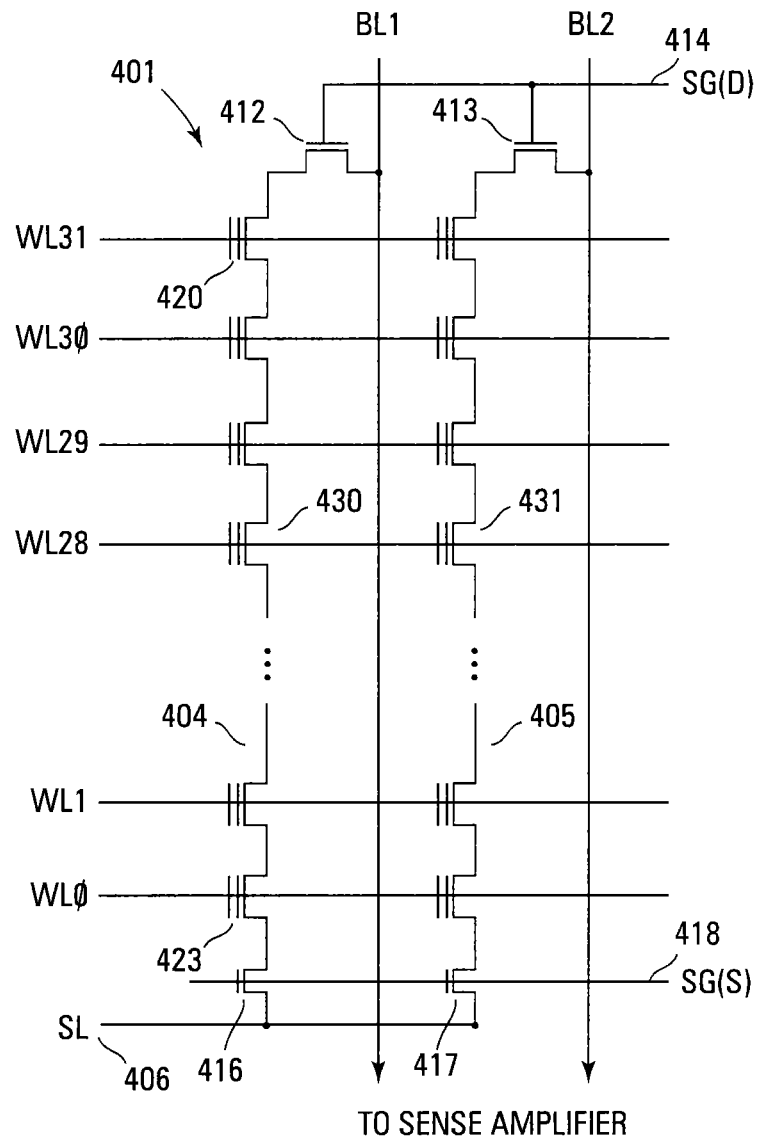
FIG. 4 shows a schematic diagram of one embodiment of a portion of a memory array.

FIG. 4 illustrates a schematic diagram of a portion of a NAND architecture memory array 401 comprising series strings of non-volatile memory cells on which the embodiments for the method for double level program verify can operate. While the subsequent discussions refer to a NAND memory device, the present embodiments are not limited to such an architecture but can be used in other memory device architectures as well.

The array comprises an array of non-volatile memory cells 420, 423 (e.g., floating gate or charge trap transistors) arranged in columns such as series strings 404, 405. Each of the cells 420, 423 is coupled drain to source in each series string 404, 405. An access line (e.g. word line) WL0-WL31 that spans across multiple series strings 404, 405 is connected to the control gates of each memory cell in a row in order to bias the control gates of the memory cells in the row. Data lines, such as bit lines BL1, BL2 are coupled to the strings and eventually connected to sense circuitry, such as sense amplifiers (not shown) that determine (e.g., detect) the state of each cell by sensing current or voltage on a particular bit line.

Each series string 404, 405 of memory cells is coupled to a source line 406 by a source select gate 416, 417 and to an individual bit line BL1, BL2 by a drain select gate 412, 413. The source select gates 416, 417 are controlled by a source select gate control line SG(S) 418 coupled to their control gates. The drain select gates 412, 413 are controlled by a drain select gate control line SG(D) 414.

Each memory cell can be programmed as SLC memory or MLC memory. Each cell's threshold voltage is indicative of the data that are stored in the cell. For example, in an SLC, a $V_t$ of 0.5V might indicate a programmed cell while a $V_t$ of −0.5V might indicate an erased cell. The MLC uses multiple $V_t$ ranges that each indicate a different state. Multilevel cells can take advantage of the analog nature of a traditional flash cell by assigning a bit pattern to a specific voltage range stored on the cell. This technology permits the storage of more than one bit per cell (e.g., two or more bits per cell), depending on the quantity of voltage ranges assigned to the cell.

Figure 5:
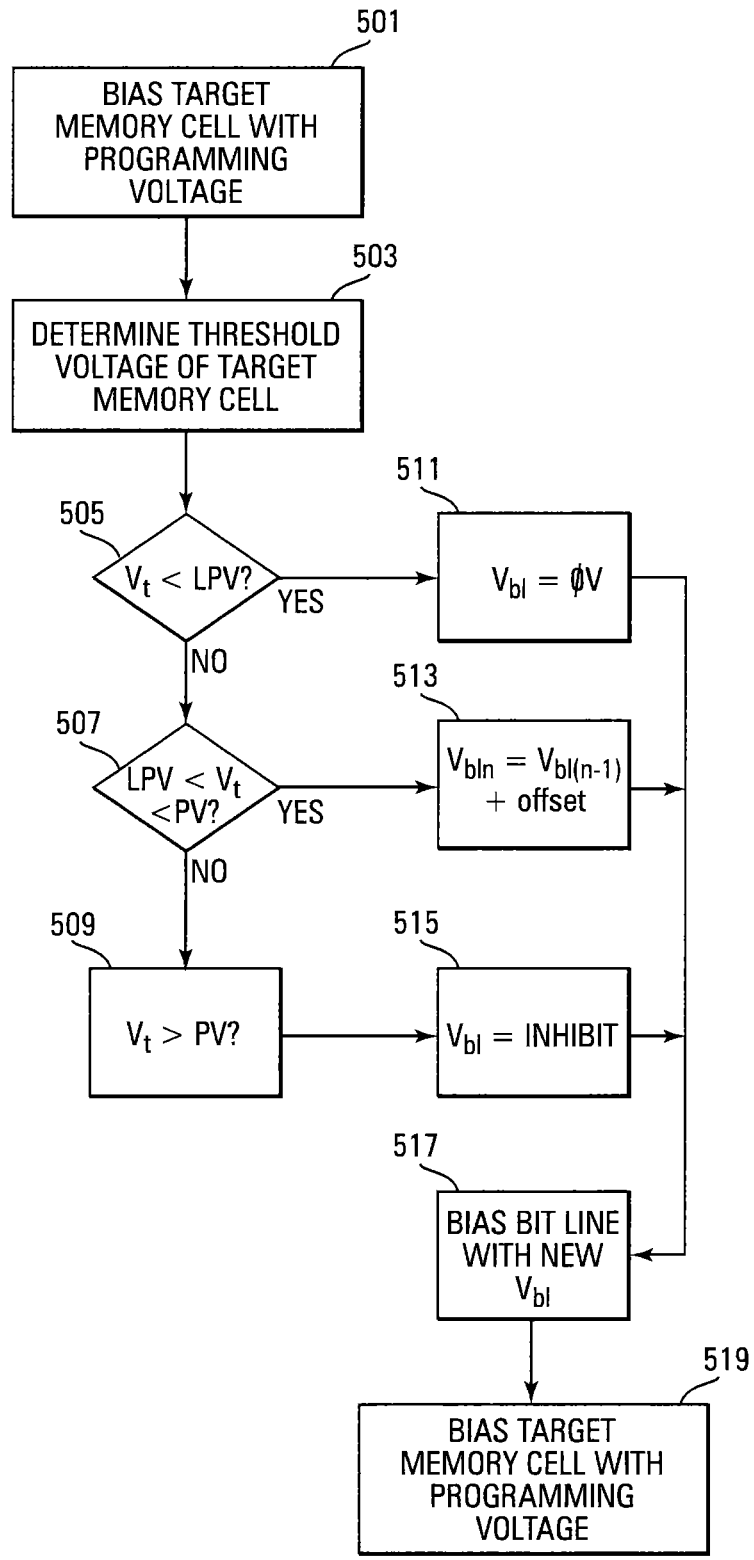
FIG. 5 shows a flowchart of one embodiment of a method for operating a memory cell that incorporates dual level verification.

FIG. 5 illustrates a flowchart of one embodiment of a method for operating a memory cell, such as a memory cell in the memory array of FIG. 4. This embodiment of operation method uses a dual level verification as part of a program operation to determine how to bias the bit lines during a subsequent programming pulse. The subsequently described method refers to the programming and program verify of a single memory cell for the sake of clarity. However, a large number of memory cells on a selected word line can be programmed and verified substantially simultaneously.

Different bit line biasing can be used to change the programming rate of memory cells. Typically, a bit line coupled to a memory cell being programmed is biased at 0V for normal programming and an inhibit voltage (e.g., supply voltage or $V_{cc}$) to stop the memory cell from programming once the memory cell has reached its target threshold voltage or if programming must be avoided (e.g., the memory cell has to be left in the erased state).

For example, a typical prior art programming of the memory array of FIG. 4 would comprise biasing BL1 at 0V and BL2 at $V_{CC}$. The bit line voltage is transferred to the selected string turning on drain select gates 412, 413 through SG(D) control line 414. This would allow the addressed cell 430 in the string of memory cells 404 coupled to the BL1 bit line to be programmed and inhibit the series string of memory cells 405 coupled to the BL2 bit line. The programming operation would then apply an initial programming pulse (e.g., 16V) on a selected word line, such as WL28, while the other word lines are biased at a pass voltage $V_{pass}$ (e.g., 10V). Since the word line is coupled to a row of memory cells, the programming voltage is applied to the control gates of those memory cells in the row. However, only memory cell 430 would experience an increase in its threshold voltage since memory cell 431 is inhibited from being programmed by the bit line bias.

Referring to FIG. 5, the method initially biases a word line coupled to a target memory cell with a programming voltage 501. This can be done in the form of a programming pulse. The threshold voltage of the target memory cell is then determined 503 by sensing a bit line current or voltage. In one embodiment, the $V_t$ determination can be accomplished by performing two "read" operations at different word line voltages (e.g., LPV and PV), precharging the bit line, and evaluating its voltage after a read time. This determines the conductive state of the cell (e.g., if the bit line discharges or remains charged).

It is determined where the threshold voltage is in relation to dual verify levels 505-509. The dual verify levels (e.g., Program Verify (PV) and Low Program Verify (LPV)) generate three different voltage ranges into which the threshold voltage of the target memory cell will fall. The location of the threshold voltage with respect to these voltage ranges determines the subsequent bit line bias voltage for the bit line coupled to the target memory cell during a subsequent programming pulse.

The PV level can be determined by the target state to which the target memory cell is being programmed. For example, if the target state is a logical 01, this state might be represented by a program verify voltage of 0.5V that is the low point of the target state distribution. Thus, PV would be 0.5V. The LPV level could then be determined as some voltage that is less than PV. The LPV level might be a percentage of the step voltage of $V_{pgm}$ (e.g., 50% of step voltage).

The determined threshold voltage is compared to the LPV level 505. If the determined threshold voltage $V_t$ is less than the LPV level 505, the bit line coupled to the target memory cell will be biased at a programming bit line voltage (e.g., $V_{bl}=0V$), 511, to enable full programming of the target memory cell during a subsequent programming pulse.

If the determined threshold voltage is between the LPV level and the PV level 507, the bit line will be biased at a variable bit line voltage between the programming voltage and the inhibit voltage 513 (e.g., between 0V and $V_{cc}$). In one embodiment, the variable bit line voltage increases responsive to (e.g., after) each programming pulse during which the determined threshold voltage is between LPV and PV.

The variable bit line voltage can be determined by adding a voltage increment $\Delta V_t$ to a previous bit line voltage. For example, the $\Delta V_t$ can be a change in the threshold voltage that was experienced in response to the previous programming pulse. The increment need not be exactly $\Delta V_t$. In one embodiment, $\Delta V_t$ is based on a change in the threshold voltage that was experienced in response to the previous programming pulse.

Another embodiment to determine the variable bit line voltage can add a constant voltage (e.g., $\Delta V_t$) to a previous bit line voltage. For example, the offset can be a constant of 0.1V that is added to each previous bit line voltage. Thus, if a first $V_{bl}=0.0V$, the next $V_{bl}=0.1V$ or, if a current $V_{bl}=0.2V$, the next $V_{bl}=0.4V$.

Another embodiment to determine the variable bit line voltage can add a decreasing bit line voltage offset (e.g., $\Delta V_{bl}$) to each previous bit line voltage. This can be represented by $V_{bl(n-1)}+\Delta V_{bl(n-1)}/2$. For example, assuming a bit line is biased with the $V_{bln}$ voltages in the order of $V_{bl1}$, $V_{bl2}$, $V_{bl3}$, $V_{bl4}$ . . . , if the first bit line voltage $V_{bl1}=0.2V$ and $\Delta V_{bl1}=0.2V$, the first bit line voltage, while the determined threshold voltage is between LPV and PV, will be $V_{bl1}=0.2V+0.2V/2=0.3V$. The second bit line voltage will be $V_{bl2}=0.3V+0.1V/2=0.35V$. The third bit line voltage will be $V_{bl3}=0.35V+0.05V/2=0.375V$. This decreasing offset addition can continue until the determined threshold voltage is at PV or greater. In one embodiment, the decreasing offset decreases by a factor different from 2 (e.g., larger or smaller). The decreasing offset addition is not limited by the disclosed methods. It can be accomplished in other ways.

If the determined threshold voltage is greater than or equal to the PV level 509, the target memory cell is considered to be programmed. In this case, the target memory cell should be inhibited from further programming One way to accomplish this is to bias the bit line coupled to the target memory cell with an inhibit voltage such as a supply voltage (e.g., $V_{bl}=V_{CC}$) 515.

After the new bit line voltage has been determined 511, 513, or 515, the bit line coupled to the target memory cell is biased at this voltage 517. Substantially simultaneously with the bit line being biased at the new $V_{bl}$, a programming voltage (e.g., programming pulse) is applied to the word line 519. The threshold voltage of the target memory cell then increases by an amount that is determined by the programming pulse voltage and by $V_{bl}$.

As one example of threshold voltage increases due to the new bit line voltage, if $V_{bl}=0V$, such as when the read $V_t<LPV$, the threshold voltage may increase by the step voltage $V_{step}$ by which the programming voltage is increased. If $V_{bl}$ is increased by a variable offset, such as when $LPV<V_t<PV$, the threshold voltage may increase by $V_{step}$ minus the variable offset (e.g., $\Delta V_t$ or $V_{offset}$). If $V_{bl}$=INHIBIT (e.g., $V_{CC}$), such as when $V_t>PV$, the threshold voltage is not increased.

FIGS. 6A-6D illustrate a result of the method to operate a memory cell. While this figure shows only one $V_t$ distribution for purposes of clarity, the results will be substantially similar when applied to a plurality of $V_t$ distributions within a single programmable window margin.

Figure 6A:
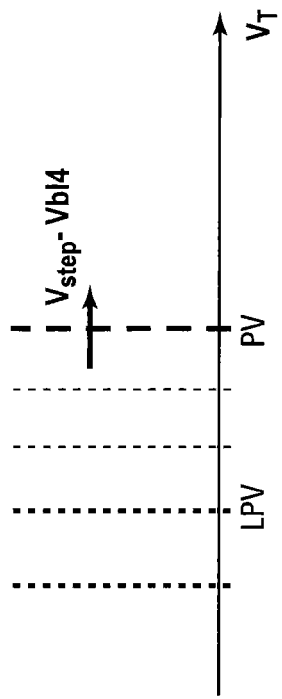
FIGS. 6A-6D show a result of a $V_t$ distribution movement in accordance with the method of FIG. 5.
Figure 6C:
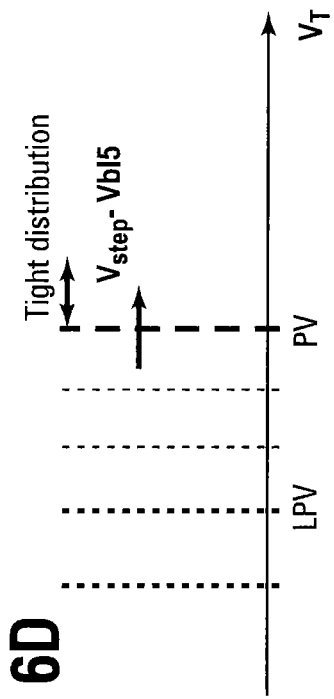
Figure 6B:
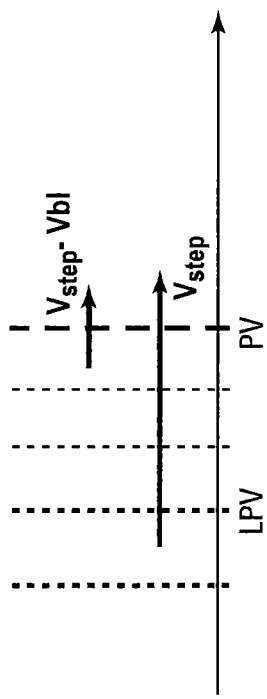
Figure 6D:
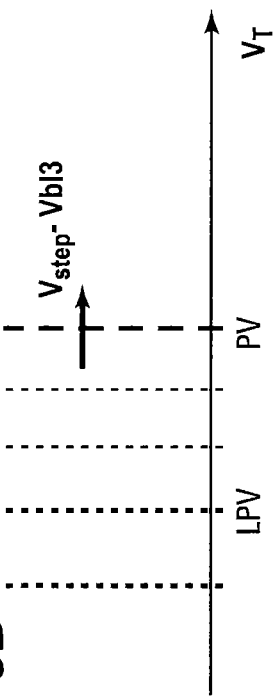

FIG. 6A shows that the memory cells with threshold voltages less than LPV are moved up faster than the memory cells with threshold voltages between LPV and PV. FIG. 6B shows the distribution after a first programming pulse with a bit line biasing of $V_{bl3}$. FIG. 6C shows the distribution after a second programming pulse with bit line biasing of $V_{bl4}$. FIG. 6D shows the distribution after a third programming pulse with a bit line biasing of $V_{bl5}$. The width of such a resulting distribution is tighter than a distribution obtained without changing the programming rate of memory cells through dual program verify and variable bit line biasing that progressively reduces the effective program pulse as a result of the increasing bit line voltage.

Figure 7:
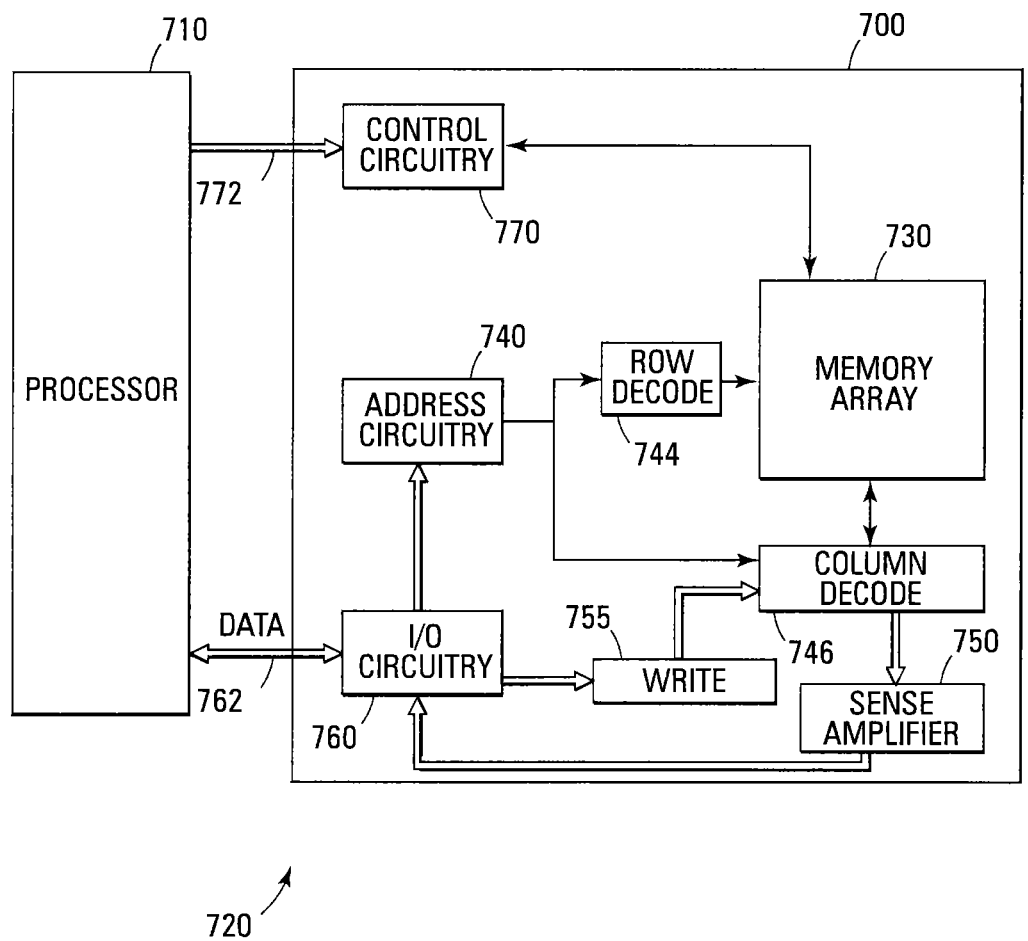
FIG. 7 shows a block diagram of one embodiment of a memory system.

FIG. 7 illustrates a functional block diagram of a memory device 700. The memory device 700 is coupled to an external processor 710. The processor 710 may be a microprocessor or some other type of controller. The memory device 700 and the processor 710 form part of a memory system 720. The memory device 700 has been simplified to focus on features of the memory that are helpful in understanding the present invention.

The memory device 700 includes an array 730 of non-volatile memory cells, such as the one illustrated previously in FIG. 4. The memory array 730 is arranged in banks of word line rows and bit line columns. In one embodiment, the columns of the memory array 730 are comprised of series strings of memory cells. As is well known in the art, the connections of the cells to the bit lines determines whether the array is a NAND architecture, an AND architecture, or a NOR architecture.

Address buffer circuitry 740 is provided to latch address signals provided through the I/O circuitry 760. Address signals are received and decoded by a row decoder 744 and a column decoder 746 to access the memory array 730. It will be appreciated by those skilled in the art, with the benefit of the present description, that the number of address input connections depends on the density and architecture of the memory array 730. The number of addresses increases with both increased memory cell counts and increased bank and block counts.

The memory device 700 reads data in the memory array 730 by sensing voltage or current changes in the memory array columns using sense circuitry 750. The sense circuitry 750, in one embodiment, is coupled to read and latch a row of data from the memory array 730. Data input and output buffer circuitry 760 is included for bidirectional data communication as well as address communication over a plurality of data connections 762 with the processor 710. Write circuitry 755 is provided to write data to the memory array.

A controller (e.g., control circuitry) 770 decodes signals provided on control connections 772 from the processor 710. These signals are used to control the operations on the memory array 730, including data read, data write (program), and erase operations. The controller 770 may be a state machine, a sequencer, or some other type of controller to generate the memory control signals. In one embodiment, the controller 770 is configured to execute the programming and dual level program verify method of the present embodiments, such as in order to tighten $V_t$ distributions.

The flash memory device illustrated in FIG. 7 has been simplified to facilitate a basic understanding of the features of the memory. A more detailed understanding of internal circuitry and functions of flash memories are known to those skilled in the art.

CONCLUSION

In summary, one or more embodiments can increase a bit line voltage by a variable amount for each subsequent programming pulse responsive to (e.g., when) a determined threshold voltage is between a low program verify level and a program verify level. The variable increase can be based on a previous bit line voltage with an added offset.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for operating a memory cell, the method comprising:
   determining a threshold voltage of the memory cell, responsive to biasing the memory cell with a program voltage; and
   increasing a voltage of a data line coupled to the memory cell responsive to the threshold voltage being between first and second program verify levels;
   wherein increasing the voltage of the data line comprises increasing a previous voltage applied to the data line by $\Delta V_{bln}$ and increasing a subsequent voltage applied to the data line by $\Delta V_{bl}/k$ wherein k is a constant.

2. The method of claim 1 and further comprising biasing the data line with a voltage responsive to the threshold voltage being less than both the first and second program verify levels.

3. The method of claim 1 and further comprising biasing the data line with an inhibit voltage responsive to the threshold voltage being greater than both the first and second program verify levels.

4. The method of claim 1 wherein the first program verify level is a low program verify level and the second program verify level is a program verify level greater than the low program verify level.

5. The method of claim 1 wherein the second program verify level is a representative voltage of a target state to which the memory cell is to be programmed.

6. The method of claim 5 wherein the second program verify level is a voltage at a low point of the target state.

7. The method of claim 1 wherein determining the threshold voltage comprises determining the threshold voltage after a programming pulse, wherein increasing a voltage of a data line comprises increasing the data line voltage for each subsequent programming pulse.

8. The method of claim 1 wherein determining the threshold voltage comprises determining the threshold voltage after a programming pulse, further comprising applying a subsequent programming pulse to the memory cell, wherein a voltage of the subsequent programming pulse is increased with respect to a voltage of the programming pulse by a voltage step.

9. A method for operating a memory cell, the method comprising:
applying a programming pulse to a control gate of a memory cell while applying a voltage to a data line coupled to the memory cell;
determining a threshold voltage of the memory cell, after the programming pulse; and
increasing the voltage applied to the data line for each subsequent programming pulse while the threshold voltage is greater than a first program verify level and less than a second program verify level;
wherein a previous voltage applied to the data line is increased by $\Delta V_{bln}$ and a subsequent voltage applied to the data line is increased by $\Delta V_{bl}/k$ wherein k is a constant.

10. The method of claim 9 wherein determining the threshold voltage comprises sensing the memory cell.

11. The method of claim 9 wherein each subsequent programming pulse is increased with respect to a voltage of a previous programming pulse by a step voltage.

12. The method of claim 11 wherein the first program verify level is a percentage of the step voltage.

13. A memory device comprising:
memory cells; and
a controller coupled to the memory cells wherein the controller is configured to cause a voltage of a data line coupled to a target memory cell of the memory cells to be increased responsive to a threshold voltage of the target memory cell being between first and second program verify voltages;
wherein the voltage of the data line is increased by $V_{step} - V_{offset}$, wherein $V_{step}$ is a difference between a present programming voltage and a previous programming voltage and $V_{offset}$ is a variable voltage.

14. The memory device of claim 13 wherein the memory device is a NAND architecture flash memory device.

15. The memory device of claim 13 wherein the controller is further configured to cause the voltage of the data line to be at an inhibit level responsive to the threshold voltage being greater than both the first and the second program verify voltages.

16. A method to operate a memory cell, the method comprising:
programming the memory cell at a first speed while a determined threshold voltage of the memory cell is smaller than a first program verify voltage; and
programming the memory cell at a second speed, lower than the first speed, while the determined threshold voltage is between the first program verify voltage and a second program verify voltage; wherein
said programming the memory cell at a first speed comprises applying a first program pulse to a control gate of the memory cell while providing a programming voltage to a data line coupled to the memory cell; and
said programming the memory cell at a second speed comprises applying a second program pulse to the control gate of the memory cell while providing an increased voltage to the data line coupled to the memory cell.

17. The method of claim 16 further comprising:
providing an inhibit voltage to the data line coupled to the memory cell in subsequent programming pulses to inhibit programming the memory cell while the determined threshold voltage is greater than the second program verify voltage.

* * * * *